United States Patent
Chen et al.

(10) Patent No.: US 11,552,632 B1
(45) Date of Patent: Jan. 10, 2023

(54) GATE DRIVE APPARATUS AND METHOD THEREOF

(71) Applicant: NuVolta Technologies (Hefei) Co., Ltd., Hefei (CN)

(72) Inventors: Junxiao Chen, Shanghai (CN); Yingying Yang, Shanghai (CN)

(73) Assignee: NuVolta Technologies (Hefei) Co., Ltd., Hefei (CN)

( * ) Notice: Subject to any disclaimer, the term of this patent is extended or adjusted under 35 U.S.C. 154(b) by 0 days.

(21) Appl. No.: 17/457,141

(22) Filed: Dec. 1, 2021

(30) Foreign Application Priority Data

Nov. 22, 2021 (CN) .......................... 202111383352.6

(51) Int. Cl.
*H03K 5/12* (2006.01)
*H03K 17/16* (2006.01)

(52) U.S. Cl.
CPC ............. *H03K 17/165* (2013.01); *H03K 5/12* (2013.01)

(58) Field of Classification Search
CPC ...... H03K 5/12; H03K 17/165; H03K 17/166; H03K 17/167
USPC .......................................... 327/108, 109, 520
See application file for complete search history.

(56) References Cited

U.S. PATENT DOCUMENTS

| 6,717,785 | B2 * | 4/2004 | Fukuda | .............. H03K 17/0828 |
| | | | | 361/86 |
| 8,350,601 | B2 * | 1/2013 | Nagata | ................. H03K 17/168 |
| | | | | 327/108 |
| 10,491,095 | B2 * | 11/2019 | Chen | ....................... B60L 1/003 |

* cited by examiner

*Primary Examiner* — William Hernandez
(74) *Attorney, Agent, or Firm* — Slater Matsil, LLP

(57) ABSTRACT

A method includes detecting a signal on a switching node connected to a power switch, detecting a gate drive voltage of the power switch, during a gate drive process of the power switch, reducing a gate drive current based on a first comparison result obtained from comparing the signal with a first threshold, and during the gate drive process of the power switch, increasing the gate drive current based on a second comparison result obtained from comparing the gate drive voltage with a second threshold.

20 Claims, 8 Drawing Sheets

GATE DRIVE APPARATUS AND METHOD THEREOF

PRIORITY CLAIM

This application claims priority to Chinese Patent Application No. 202111383352.6, filed on Nov. 22, 2021, which is hereby incorporated by reference in its entirety.

TECHNICAL FIELD

The present invention relates to a gate drive apparatus and method, and, in particular embodiments, to an adaptive slew rate control based gate drive apparatus and method.

BACKGROUND

As technologies further advance, a variety of electronic devices, such as mobile phones, tablet PCs, digital cameras, MP3 players and/or the like, have become popular. Each electronic device may be powered by a power converter.

The power converter such as a buck converter includes two power switches connected in series. A first power switch not connected to ground is referred to as a high-side switch. A second power switch connected to ground is referred to as low-side switch. A common node of the high-side switch and the low-side switch is a switching node of the power converter. A low-side gate drive circuit and a high-side gate drive circuits are employed to control the gates of the low-side switch and the high-side switch, respectively. The bias supply of the low-side gate drive circuit is supplied from a regulated bias voltage source. The high-side gate drive circuit may need a gate voltage higher than the voltage of the input power source connected to the power converter.

The low-side switch and the high-side switch may be implemented as metal oxide semiconductor field effect transistors (MOSFET). MOSFETs are voltage controlled devices. When a gate drive voltage is applied to the gate of a MOSFET, and the gate drive voltage is greater than the turn-on threshold of the MOSFET, a conductive channel is established between the drain and the source of the MOSFET. After the conductive channel has been established, a current flows between the drain and the source of the MOSFET. On the other hand, when the gate drive voltage applied to the gate is less than the turn-on threshold of the MOSFET, the MOSFET is turned off accordingly.

In operation, the turn-on and turn-off of the power switch cause a variety of issues. For example, a fast turn-on and/or turn-off of the power switch may generate switching noise causing Electromagnetic interference (EMI). Furthermore, the fast turn-on and/or turn-off of the power switch may cause voltage spikes that can damage the power switch. The issues above can be resolved through reducing the slew rate of the switching node voltage. However, a reduced slew rate of the switching node voltage may increase the switching losses of the power switch. It would be desirable to have a simple and reliable slew rate control method so as to have a balance between improving efficiency and solving EMI issues.

SUMMARY

These and other problems are generally solved or circumvented, and technical advantages are generally achieved, by preferred embodiments of the present disclosure which provide an adaptive slew rate control based gate drive apparatus and method.

In accordance with an embodiment, an apparatus comprises a pull-up gate drive circuit configured to reduce a pull-up current fed into a gate of a power switch from a first predetermined pull-up current level to a second predetermined pull-up current level once a signal on a switching node changes over a first turn-on threshold, and increase the pull-up current fed into the gate of the power switch from the second predetermined pull-up current level to the first predetermined pull-up current level once a gate drive voltage exceeds a second turn-on threshold, and a pull-down gate drive circuit configured to reduce a pull-down current drawn from the gate of the power switch from a first predetermined pull-down current level to a second predetermined pull-down current level once the signal on the switching node changes over a first turn-off threshold, and increase the pull-down current drawn from the gate of the power switch from the second predetermined pull-down current level to the first predetermined pull-down current level once the gate drive voltage drops below a second turn-off threshold.

In accordance with another embodiment, a method comprises detecting a signal on a switching node connected to a power switch, detecting a gate drive voltage of the power switch, during a gate drive process of the power switch, reducing a gate drive current based on a first comparison result obtained from comparing the signal with a first threshold, and during the gate drive process of the power switch, increasing the gate drive current based on a second comparison result obtained from comparing the gate drive voltage with a second threshold.

In accordance with yet another embodiment, a controller comprises a first sensing circuit configured to receive a gate drive voltage of a power switch, a second sensing circuit configured to receive a voltage on a switching node connected to the power switch, and an adaptive slew rate control apparatus comprising a pull-up gate drive circuit and a pull-down gate drive circuit, wherein the pull-up gate drive circuit is configured to reduce a pull-up current fed into a gate of the power switch from a first predetermined pull-up current level to a second predetermined pull-up current level once the voltage on a switching node changes over a first turn-on threshold, and increase the pull-up current fed into the gate of the power switch from the second predetermined pull-up current level to the first predetermined pull-up current level once the gate drive voltage exceeds a second turn-on threshold, and the pull-down gate drive circuit is configured to reduce a pull-down current drawn from the gate of the power switch from a first predetermined pull-down current level to a second predetermined pull-down current level once the voltage on the switching node changes over a first turn-off threshold, and increase the pull-down current drawn from the gate of the power switch from the second predetermined pull-down current level to the first predetermined pull-down current level once the gate drive voltage drops below a second turn-off threshold.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to preferred embodiments in a specific context, namely an adaptive slew rate control based gate drive apparatus and method. The disclosure may also be applied, however, to a variety of gate drive systems. Hereinafter, various embodiments will be explained in detail with reference to the accompanying drawings.

Figure 1:
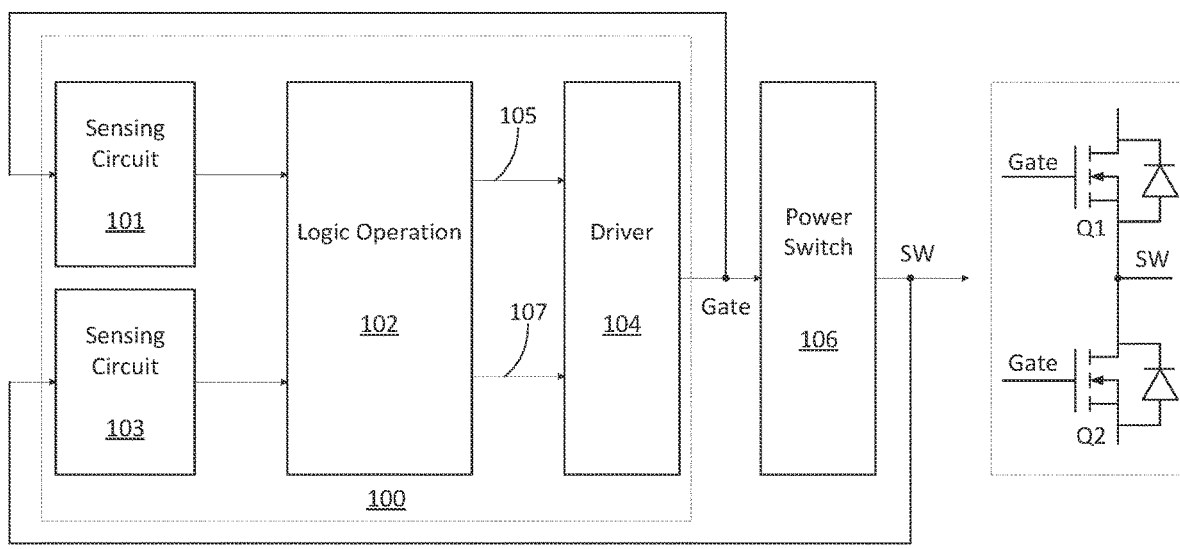
FIG. 1 illustrates a block diagram of a gate drive controller in accordance with various embodiments of the present disclosure.

FIG. 1 illustrates a block diagram of a gate drive controller in accordance with various embodiments of the present disclosure. The gate drive controller 100 is configured to generate a gate drive signal applied to a gate of a power switch 106. In some embodiments, the power switch 106 may be a low-side switch (e.g., switch Q2 shown in FIG. 1). In alternative embodiments, the power switch 106 may be a high-side switch (e.g., switch Q1 shown in FIG. 1).

As shown in FIG. 1, a first switch Q1 and a second switch Q2 are connected in series. The first switch Q1 may be alternatively referred to as a high-side switch. The second switch Q2 may be alternatively referred to as a low-side switch. A common node of Q1 and Q2 is a switching node (SW). In some embodiments, Q1 and Q2 may be part of a step-down power converter. In alternative embodiments, Q1 and Q2 may be part of an H-bridge used in motor drive applications. Furthermore, Q1 and Q2 may form a leg of a full-bridge in wireless power transfer systems.

In accordance with an embodiment, the switches of FIG. 1 (e.g., switches Q1 and Q2) may be metal oxide semiconductor field-effect transistor (MOSFET) devices, bipolar junction transistor (BJT) devices, super junction transistor (SJT) devices, insulated gate bipolar transistor (IGBT) devices, gallium nitride (GaN) based power devices and/or the like.

The gate drive controller 100 comprises a first sensing circuit 101, a second sensing circuit 103, a logic operation unit 102 and a driver 104. The first sensing circuit 101 is configured to receive a gate drive voltage applied to the gate of the power switch 106. The gate drive voltage of the power switch 106 is processed in the first sensing circuit 101. The output signal of the first sensing circuit 101 is fed into the logic operation unit 102. The second sensing circuit 103 is configured to receive a signal on the switching node SW. In some embodiments, the signal is a voltage on the switching node SW. The voltage on the switching node SW is processed in the second sensing circuit 103. The output signal of the second sensing circuit 103 is fed into the logic operation unit 102. Based on the received signals, the logic operation unit 102 is configured to generate a plurality of pull-up control signals 105 and a plurality of pull-down control signals 107 fed into the driver 104.

The driver 104 comprises a pull-up gate drive circuit and a pull-down gate drive circuit. In some embodiments, the pull-up gate drive circuit and the pull-down gate drive circuit are configured such that a slew rate of the voltage on the switching node SW can be adjusted accordingly. Throughout the description, the driver 104 may be alternatively referred to as an adaptive slew rate control apparatus.

In some embodiments, the adaptive slew rate control apparatus comprises the pull-up gate drive circuit and the pull-down gate drive circuit connected in series between a first voltage bus (e.g., a bias voltage bus) and a second voltage bus (e.g., ground). A common node of the pull-up gate drive circuit and the pull-down gate drive circuit is connected to the gate of the power switch 106.

The pull-up gate drive circuit is configured to reduce a pull-up current fed into the gate of the power switch 106 from a first predetermined pull-up current level to a second predetermined pull-up current level once the voltage on the switching node changes over a first turn-on threshold, and increase the pull-up current fed into the gate of the power switch 106 from the second predetermined pull-up current level to the first predetermined pull-up current level once a gate drive voltage exceeds a second turn-on threshold. The detailed operating principle of the pull-up gate drive circuit will be described below with respect to FIGS. 4 and 6. It should be noted that the first turn-on threshold may have two different values depending on two different applications. When the power switch 106 is a low side switch, the first turn-on threshold is a voltage slightly less than the steady state voltage on the switching node after the low side switch is turned off and the high side switch is turned on. When the power switch 106 is a low side switch, the pull-up current is reduced once the voltage on the switching node drops below the first turn-on threshold. When the power switch 106 is a high side switch, the first turn-on threshold is a voltage slightly higher than the steady state voltage on the switching node after the high side switch is turned off and the low side switch is turned on. When the power switch 106 is a high side switch, the pull-up current is reduced once the voltage on the switching node exceeds the first turn-on threshold.

The pull-down gate drive circuit is configured to reduce a pull-down current drawn from the gate of the power switch 106 from a first predetermined pull-down current level to a second predetermined pull-down current level once the voltage on the switching node changes over a first turn-off threshold, and increase the pull-down current drawn from the gate of the power switch 106 from the second predetermined pull-down current level to the first predetermined pull-down current level once the gate drive voltage drops below a second turn-off threshold. The detailed operating principle of the pull-down gate drive circuit will be described below with respect to FIGS. 5 and 7. It should be noted that the first turn-off threshold may have two different values depending on two different applications. When the power switch 106 is a low side switch, the first turn-off threshold is a voltage slightly greater than the steady state voltage on the switching node after the low side switch is turned on and the high side switch is turned off. When the power switch 106 is a low side switch, the pull-down current is reduced once the voltage on the switching node exceeds the first turn-off threshold. When the power switch 106 is a high side switch, the first turn-off threshold is a voltage slightly less than the steady state voltage on the switching node after the high side switch is turned on and the low side switch is turned off. When the power switch 106 is a high side switch, the pull-down current is reduced once the voltage on the switching node drops below the first turn-off threshold.

Figure 2:
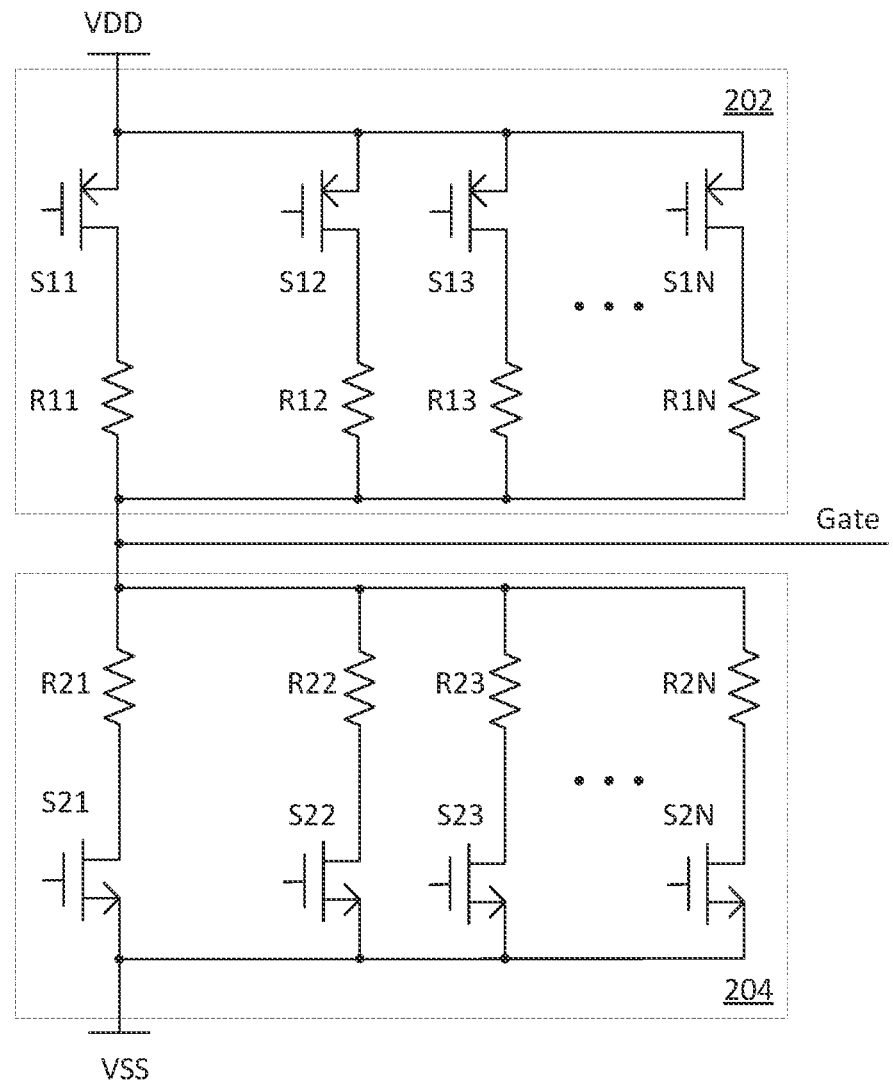
FIG. 2 illustrates a first implementation of the adaptive slew rate control apparatus in accordance with various embodiments of the present disclosure.

FIG. 2 illustrates a first implementation of the adaptive slew rate control apparatus in accordance with various embodiments of the present disclosure. The adaptive slew rate control apparatus comprises a pull-up gate drive circuit 202 and a pull-down gate drive circuit 204. The pull-up gate drive circuit 202 comprises a plurality of pull-up switch-resistor networks connected in parallel between a first voltage bus VDD and the gate of the power device (shown in FIG. 1). In some embodiments, VDD is a connected to a bias voltage source.

As shown in FIG. 2, a switch S11 and a resistor R11 are connected in series to form a first pull-up switch-resistor network. A switch S12 and a resistor R12 are connected in series to form a second pull-up switch-resistor network. A switch S13 and a resistor R13 are connected in series to form a third pull-up switch-resistor network. A switch S1N and a resistor R1N are connected in series to form an nth pull-up switch-resistor network.

Referring back to FIG. 1, the plurality of pull-up control signals 105 is fed into the adaptive slew rate control apparatus 104. The plurality of pull-up control signals 105 is employed to control the on/off of the switches S11-S1N shown in FIG. 2. Through controlling the on/off of the switches S11-S1N, the pull-up current flowing through the pull-up gate drive circuit 202 can be controlled accordingly. The adjustable pull-up current can be used to change the slew rate of the voltage on the switching node during a turn-on process of the power device. The detailed process of using the adjustable pull-up current to change the slew rate of the voltage on the switching node will be described below with respect to FIG. 4.

The pull-down gate drive circuit 204 comprises a plurality of pull-down switch-resistor networks connected in parallel between and the gate of the power device and a second voltage bus VSS. In some embodiments, VSS is a connected to a ground voltage potential.

As shown in FIG. 2, a switch S21 and a resistor R21 are connected in series to form a first pull-down switch-resistor network. A switch S22 and a resistor R22 are connected in series to form a second pull-down switch-resistor network. A switch S23 and a resistor R23 are connected in series to form a third pull-down switch-resistor network. A switch S2N and a resistor R1N are connected in series to form an nth pull-down switch-resistor network.

Referring back to FIG. 1, the plurality of pull-down control signals 107 is fed into the adaptive slew rate control apparatus 104. The plurality of pull-down control signals 107 is employed to control the on/off of the switches S21-S2N shown in FIG. 2. Through controlling the on/off of the switches S21-S2N, the pull-down current flowing through the pull-down gate drive circuit 204 can be controlled accordingly. The adjustable pull-down current can be used to change the slew rate of the voltage on the switching node during a turn-off process of the power device. The detailed process of using the adjustable pull-down current to change the slew rate of the voltage on the switching node will be described below with respect to FIG. 5.

Figure 3:
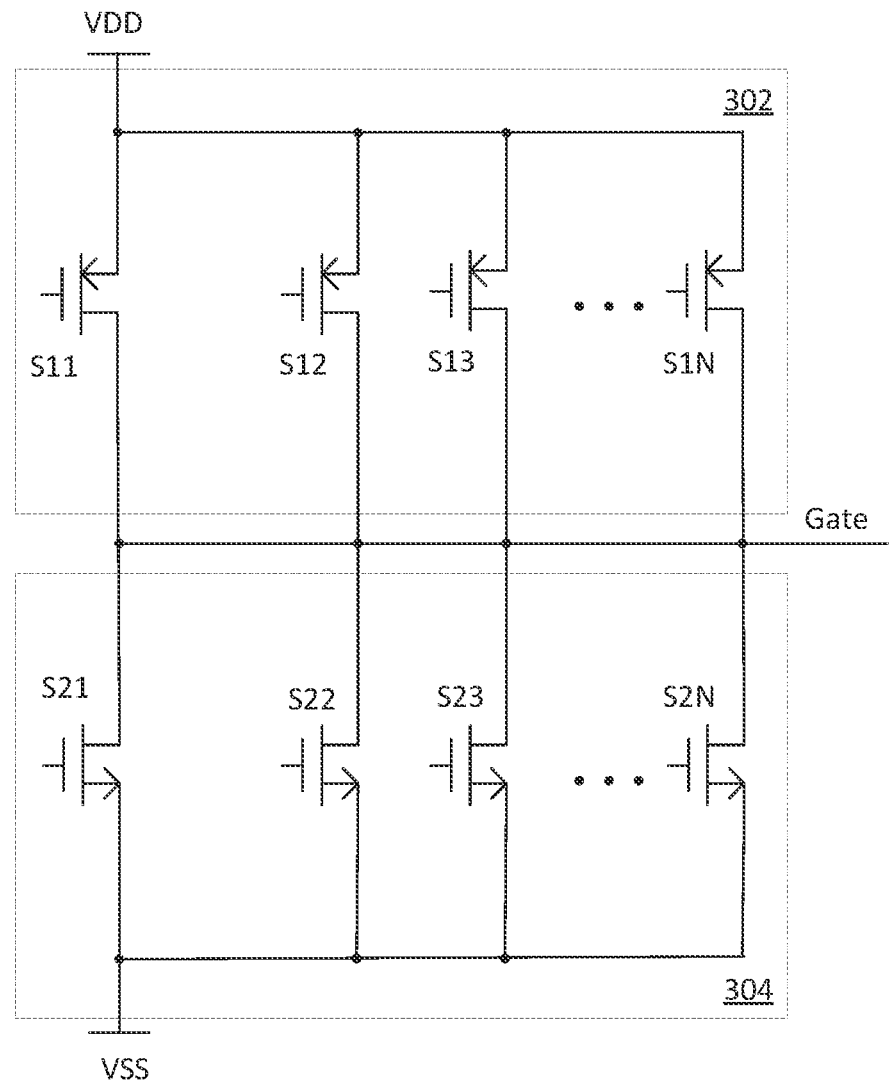
FIG. 3 illustrates a second implementation of the adaptive slew rate control apparatus in accordance with various embodiments of the present disclosure.

FIG. 3 illustrates a second implementation of the adaptive slew rate control apparatus in accordance with various embodiments of the present disclosure. The adaptive slew rate control apparatus comprises a pull-up gate drive circuit 302 and a pull-down gate drive circuit 304. The pull-up gate drive circuit 302 comprises a plurality of pull-up switches S11, S12, S13 and S1N connected in parallel between a first voltage bus VDD and the gate of the power device. In operation, at least one gate drive voltage applied to one of the plurality of pull-up switches S11, S12, S13 and S1N is modulated so as to adjust the pull-up current flowing through the pull-up gate drive circuit 302.

The pull-down gate drive circuit 304 comprises a plurality of pull-down switches S21, S22, S23 and S2N connected in parallel between the gate of the power device and a second voltage bus VSS. In operation, at least one gate drive voltage applied to one of the plurality of pull-down switches S21, S22, S23 and S2N is modulated so as to adjust the pull-down current flowing through the pull-down gate drive circuit 304.

Figure 4:
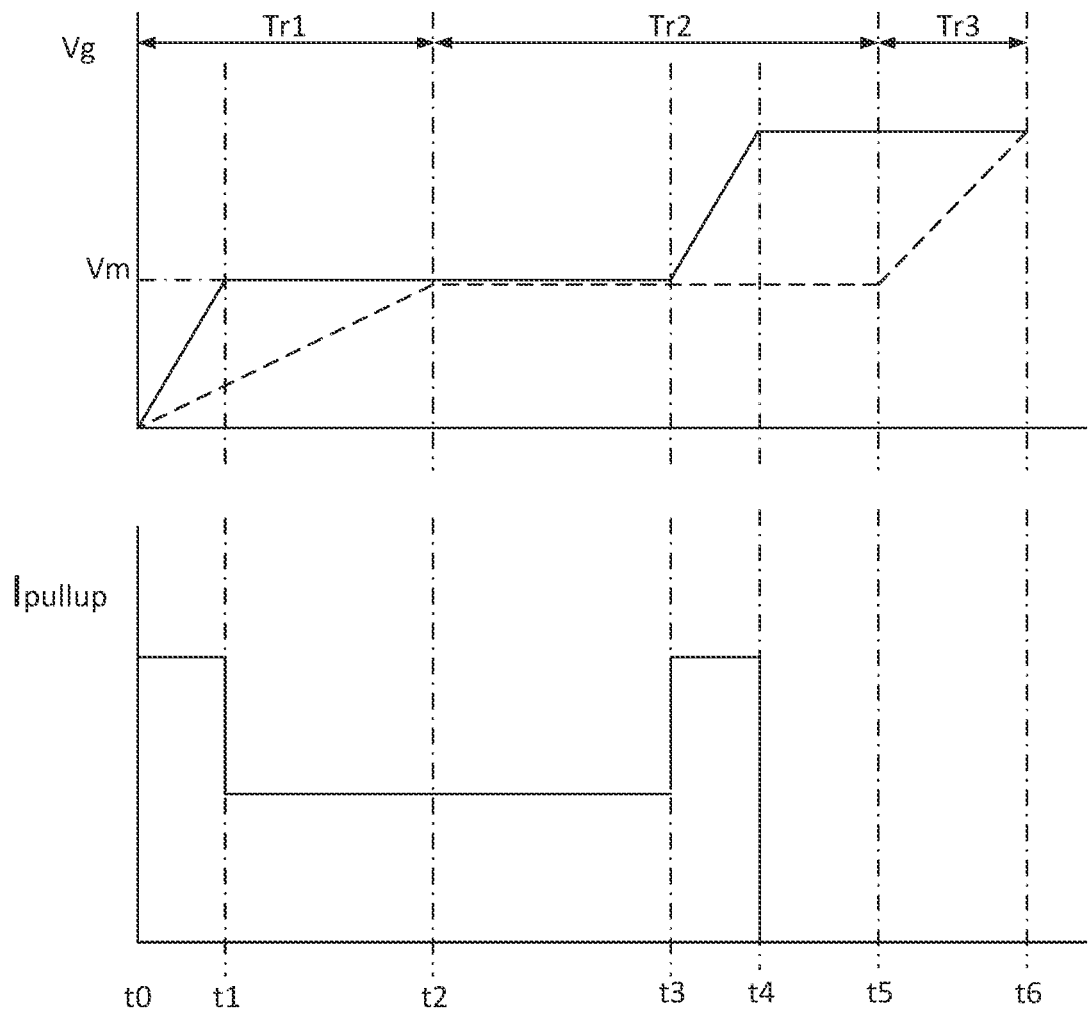
FIG. 4 illustrates a gate voltage and a pull-up drive current of the power device during a turn-on process of the power device in accordance with various embodiments of the present disclosure.

FIG. 4 illustrates a gate voltage and a pull-up drive current of the power device during a turn-on process of the power device in accordance with various embodiments of the present disclosure. The dashed line of the gate drive voltage Vg represents the turn-on process without employing the adaptive slew rate control apparatus shown in FIG. 2. The dashed line of the gate drive voltage Vg can be divided into three intervals as shown in FIG. 4. In a first interval Tr1 (from t0 to t2), the gate drive voltage in the dashed line rises from zero to the Miller plateau level after the pull-up current charges the gate-to-source capacitor of the power device. In a second interval Tr2 (from t2 to t5), the drain-to-source voltage of the power device starts to decrease. The gate drive voltage in the dashed line stays steady as shown in FIG. 4. The second interval Tr2 is the Miller plateau region in the gate drive voltage waveform. The second interval Tr2 shown in FIG. 4 may be alternatively referred to as a Miller plateau phase of the turn-on process. In a third interval Tr3 (from t5 to t6), the gate drive voltage in the dashed line rises from the Miller plateau region to a higher voltage level, which is a final gate drive voltage. The final gate drive voltage determines the on-resistance of the power device.

The adaptive slew rate control apparatus shown in FIG. 2 is employed to improve the turn-on process of the power switch. As shown in FIG. 4, from t0 to t1, a pull-up current having a first predetermined current level is used to charge the gate-to-source capacitor. The gate drive voltage in the solid line rises in a linear manner from zero to the Miller plateau level Vm. After the gate drive voltage reaches Vm, the voltage on the switching node (e.g., the drain of the power device) starts to fall (the solid line of Vsw illustrated in FIG. 6). It should be noted that the example above is based on a low side switch. When the power switch is a high side switch, the voltage on the switching node starts to increase (the dashed line of Vsw illustrated in FIG. 6) after the gate drive voltage reaches Vm. At t1, the pull-up current (Ipullup) fed into the gate of the power switch is reduced from the first predetermined current level to a second predetermined current level once the voltage on the switching node drops below a first threshold (shown in FIG. 6). It should be noted that the example above is based on a low side switch. When the power switch is a high side switch, the pull-up current (Ipullup) fed into the gate of the power switch is reduced from the first predetermined current level to a second predetermined current level once the voltage on the switching node exceeds a predetermined threshold (e.g., a threshold slightly greater than the ground voltage potential). From t1 to t3, the pull-up current stays steady. At t3, the pull-up current fed into the gate of the power switch is increased from the second predetermined current level to the first predetermined current level once the gate drive voltage exceeds a second threshold (shown in FIG. 6). From t3 to t4, the gate drive voltage in the solid line rises in a linear manner from the Miller plateau level Vm to the final gate drive voltage. After t4, the gate drive voltage stays steady.

During the turn-on process of the power switch, the switching node transition time is approximately equal to the second interval Tr2. In other words, the slew rate of the voltage on the switching node is determined by the second interval Tr2. In comparison with the conventional gate drive apparatus (the gate drive voltage in the dashed line), Tr2 in this disclosure is approximately equal to Tr2 of the conventional gate drive apparatus. Tr1 and Tr3 in this disclosure have been significantly reduced through adjusting the pull-up currents in Tr1 and Tr3. The slew rate of the voltage on the switching node can be relatively slowed down through maintaining Tr2 the same as that of the conventional gate drive apparatus. The total turn-on gate transition time can be reduced through reducing Tr1 and Tr3, thereby minimizing the switching losses.

In operation, during the turn-on process of the power switch, the total turn-on gate transition time can be reduced through adjusting a difference between the first predetermined current level and the second predetermined current level. In some embodiment, the first predetermined current level (the pull-up current in Tr1 and Tr3) is at least twice the second predetermined current level (the pull-up current in Tr2). In some embodiments, depending on design needs and different applications, the first predetermined current level may be four or five times greater than the second predetermined current level.

In some embodiments, after using the adaptive slew rate control apparatus, Tr1 is reduced into a range from about 2 ns to about 20 ns. Tr2 is maintained in a range from about 10 ns to about 100 ns. Tr3 is reduced into a range from about 2 ns to 20 ns.

It should be noted that the turn-on process using the adaptive slew rate control apparatus described above is merely an exemplary process and is not meant to limit the current embodiments. Other turn-on processes, such as only reducing Tr1 or only reducing Tr3, may alternatively be used. Other embodiments (only increasing the pull-up current in Tr1 and only increasing the pull-up current in Tr3) are fully intended to be included within the scope of the embodiments discussed herein.

One advantageous feature of having the adaptive slew rate control apparatus shown in FIGS. 2-3 is maintaining the pull-up current the same in Tr2 to reduce EMI, and increasing the pull-up current to a higher level in Tr1 and/or Tr3 to reducing the switching losses. Furthermore, the adaptive slew rate control apparatus helps to reduce the dead time between high-side switch and low-side switch transitions.

Figure 5:
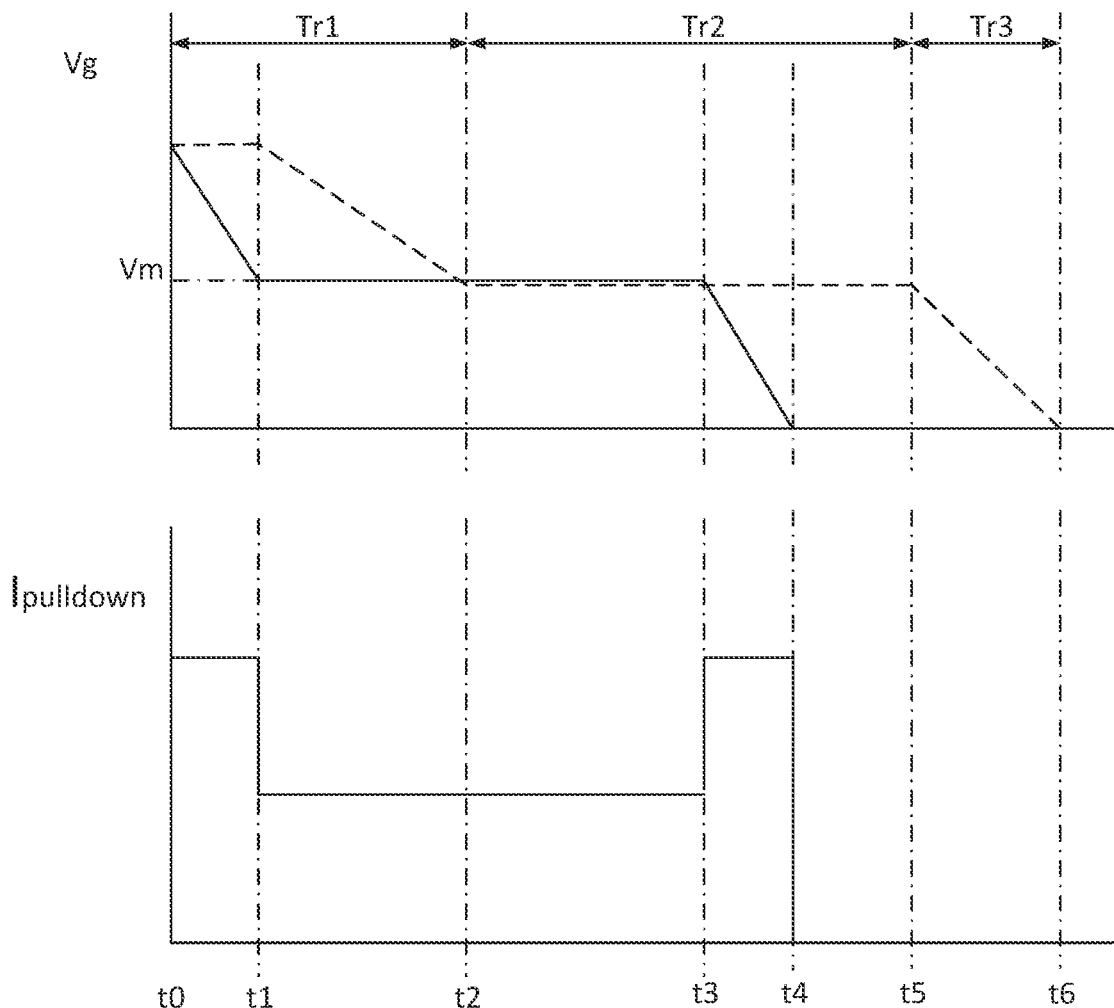
FIG. 5 illustrates a gate voltage and a pull-down drive current of the power device during a turn-off process of the power device in accordance with various embodiments of the present disclosure.

FIG. 5 illustrates a gate voltage and a pull-down drive current of the power device during a turn-off process of the power device in accordance with various embodiments of the present disclosure. The dashed line of the gate drive voltage Vg represents the turn-off process without employing the adaptive slew rate control apparatus shown in FIG. 2. The dashed line of the gate drive voltage Vg can be divided into three intervals as shown in FIG. 5. In a first interval Tr1 (from t0 to t2), the gate drive voltage in the dashed line drops from the final gate drive voltage to the Miller plateau level after the pull-down current discharges the gate-to-source capacitor of the power device. In a second interval Tr2 (from t2 to t5), the drain voltage (e.g., the voltage on the switching node) of the power device starts to rise. The gate drive voltage in the dashed line stays steady as shown in FIG. 5. The second interval Tr2 is the Miller plateau region in the gate drive voltage waveform. The second interval Tr2 shown in FIG. 5 may be alternatively referred to as a Miller plateau phase of the turn-off process. In a third interval Tr3 (from t5 to t6), the gate drive voltage in the dashed line drops from the Miller plateau region to zero. It should be noted that the example described in this paragraph is based on a low side switch. When the power switch is a high side switch, in the second interval Tr2 (from t2 to t5), the voltage on the switching node starts to decrease.

The adaptive slew rate control apparatus shown in FIG. 2 is employed to improve the turn-off process of the power switch. As shown in FIG. 5, from t0 to t1, a pull-down current having a first predetermined current level is used to discharge the gate-to-source capacitor. The gate drive voltage in the solid line drops in a linear manner from the final gate drive voltage to the Miller plateau level Vm. After the gate drive voltage in the solid line reaches Vm, the voltage on the switching node (e.g., the drain of the power device) starts to rise (not shown but illustrated in FIG. 7). At t1, the pull-down current (Ipulldown) fed into the gate of the power switch is reduced from the first predetermined current level to a second predetermined current level once the voltage on the switching node exceeds a first threshold (shown in FIG. 7). From t1 to t3, the pull-down current stays steady. At t3, the pull-down current fed into the gate of the power switch is increased from the second predetermined current level to the first predetermined current level once the gate drive voltage in the solid line drops below a second threshold (shown in FIG. 7). From t3 to t4, the gate drive voltage in the solid line drops in a linear manner from the Miller plateau level Vm to zero. It should be noted that the example described in this paragraph is based on a low side switch. When the power switch is a high side switch, the voltage on the switching node starts to drop (the dashed line of Vsw illustrated in FIG. 7). At t1, the pull-down current (Ipulldown) fed into the gate of the power switch is reduced from the first predetermined current level to a second predetermined current level once the voltage on the switching node drops below a first threshold.

During the turn-off process of the power switch, the slew rate of the voltage on the switching node is determined by the second interval Tr2. In comparison with the conventional gate drive apparatus (the gate drive voltage in the dashed line), Tr2 in this disclosure is approximately equal to Tr2 of the conventional gate drive apparatus. Tr1 and Tr3 in this disclosure have been significantly reduced through adjusting the pull-down currents in Tr1 and Tr3. The slew rate of the voltage on the switching node can be relatively slowed down through maintaining Tr2 the same as that of the conventional gate drive apparatus. The total turn-off gate transition time can be improved through reducing Tr1 and Tr3, thereby reducing the switching losses.

In operation, during the turn-off process of the power switch, the total turn-off gate transition time can be reduced through adjusting a difference between the first predetermined current level and the second predetermined current level. In some embodiment, the first predetermined current level (the pull-down current in Tr1 and Tr3) is at least twice the second predetermined current level (the pull-down current in Tr2). In some embodiments, depending on design needs and different applications, the first predetermined current level may be four or five times greater than the second predetermined current level.

In some embodiments, after using the adaptive slew rate control apparatus, Tr1 is reduced into a range from about 2 ns to about 20 ns. Tr2 is maintained in a range from about 10 ns to about 100 ns. Tr3 is reduced into a range from about 2 ns to 20 ns.

It should be noted that the turn-off process using the adaptive slew rate control apparatus described above is merely an exemplary process and is not meant to limit the current embodiments. Other turn-off processes, such as only reducing Tr1 or only reducing Tr3, may alternatively be used. Other embodiments (only increasing the pull-down current in Tr1 and only increasing the pull-down current in Tr3) are fully intended to be included within the scope of the embodiments discussed herein.

One advantageous feature of having the adaptive slew rate control apparatus is maintaining the pull-down current the same in Tr2 to reduce EMI, and increasing the pull-down current to a higher level in Tr1 and/or Tr3 to reducing the switching losses. Furthermore, the increased pull-down current in Tr3 helps to fix the gate coupling issue. Moreover, the adaptive slew rate control apparatus helps to reduce the dead time between high-side switch and low-side switch transitions.

Figure 6:
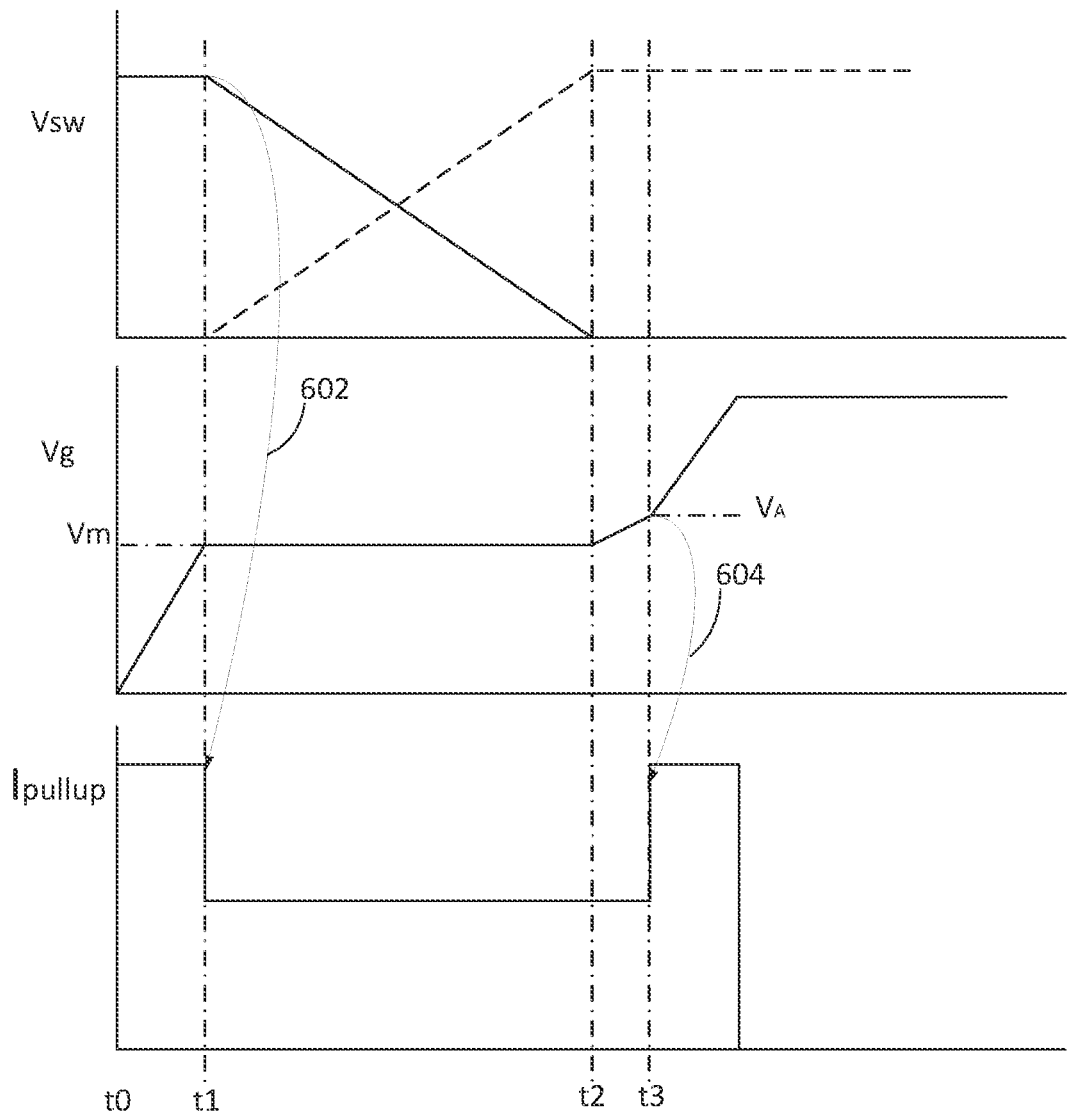
FIG. 6 illustrates a switching node voltage, a gate voltage and a pull-up drive current of the power device during a turn-on process of the power device in accordance with various embodiments of the present disclosure.

FIG. 6 illustrates a switching node voltage, a gate voltage and a pull-up drive current of the power device during a turn-on process of the power device in accordance with various embodiments of the present disclosure. When the power switch is a low side switch, the solid line of Vsw is used to determine when the power switch enters into a Miller plateau phase of the turn-on process. In particular, during the turn-on process of the power switch, from t0 to t1, the pull-up current charges the gate-to-source capacitor of the power switch. The gate drive voltage rises from zero to the Miller plateau level Vm at t1. Once the gate drive voltage reaches Vm, the switching node voltage Vsw (the solid line of Vsw) starts to drop. The switching node voltage Vsw is compared with a first predetermined threshold. The comparison result obtained from comparing the switching node voltage Vsw with the first predetermined threshold is used to determine when the power switch enters into the Miller plateau phase of the turn-on process. Once the power switch enters into a Miller plateau phase of the turn-on process, the pull-up current is reduced from a high level to a low level as indicated by the dashed line 602. When the power switch is a high side switch, the dashed line of Vsw is used to determine when the power switch enters into a Miller plateau phase of the turn-on process. In particular, during the turn-on process of the power switch, from t0 to t1, the pull-up current charges the gate-to-source capacitor of the power switch. The gate drive voltage rises from zero to the Miller plateau level Vm at t1. Once the gate drive voltage reaches Vm, the switching node voltage Vsw (the dashed line of Vsw) starts to increase. The switching node voltage Vsw is compared with a predetermined threshold (e.g., a voltage threshold slightly greater than the ground voltage potential). The comparison result obtained from comparing the switching node voltage Vsw with the predetermined threshold is used to determine when the power switch enters into the Miller plateau phase of the turn-on process. Once the power switch enters into a Miller plateau phase of the turn-on process, the pull-up current is reduced from a high level to a low level.

At t2, the switching node voltage Vsw drops to zero for a low side switch (the switching node voltage Vsw rises to a high voltage for a high side switch). The gate drive voltage starts to rise. At t3, the gate drive voltage reaches $V_A$. $V_A$ is a predetermined threshold. $V_A$ is greater than the Miller plateau level Vm. The gate drive voltage is compared with $V_A$. The comparison result obtained from comparing the gate drive voltage with $V_A$ is used to determine when the power switch leaves the Miller plateau phase of the turn-on process. Once the power switch leaves Miller plateau phase of the turn-on process, the pull-up current is increased from a low level to a high level as indicated by the dashed line 604.

It should be noted that FIG. 6 shows the switching node voltage Vsw is used to determine when the power switch enters into a Miller plateau phase of the turn-on process. This is merely an example. In alternative embodiments, the gate drive voltage may be used to determine when the power switch enters into a Miller plateau phase of the turn-on process.

It should further be noted that the comparison between the voltage on the switching node and the first predetermined threshold is used to determine when the power switch enters into a Miller plateau phase of the turn-on process. This is merely an example. In alternative embodiments, a different operating parameter can used to determine when the power switch enters into a Miller plateau phase. For example, the operating parameter may be one variable selected from the group consisting of a switching node voltage difference over time, a slew rate of the switching node voltage difference over time and a current flowing through the power switch.

Figure 7:
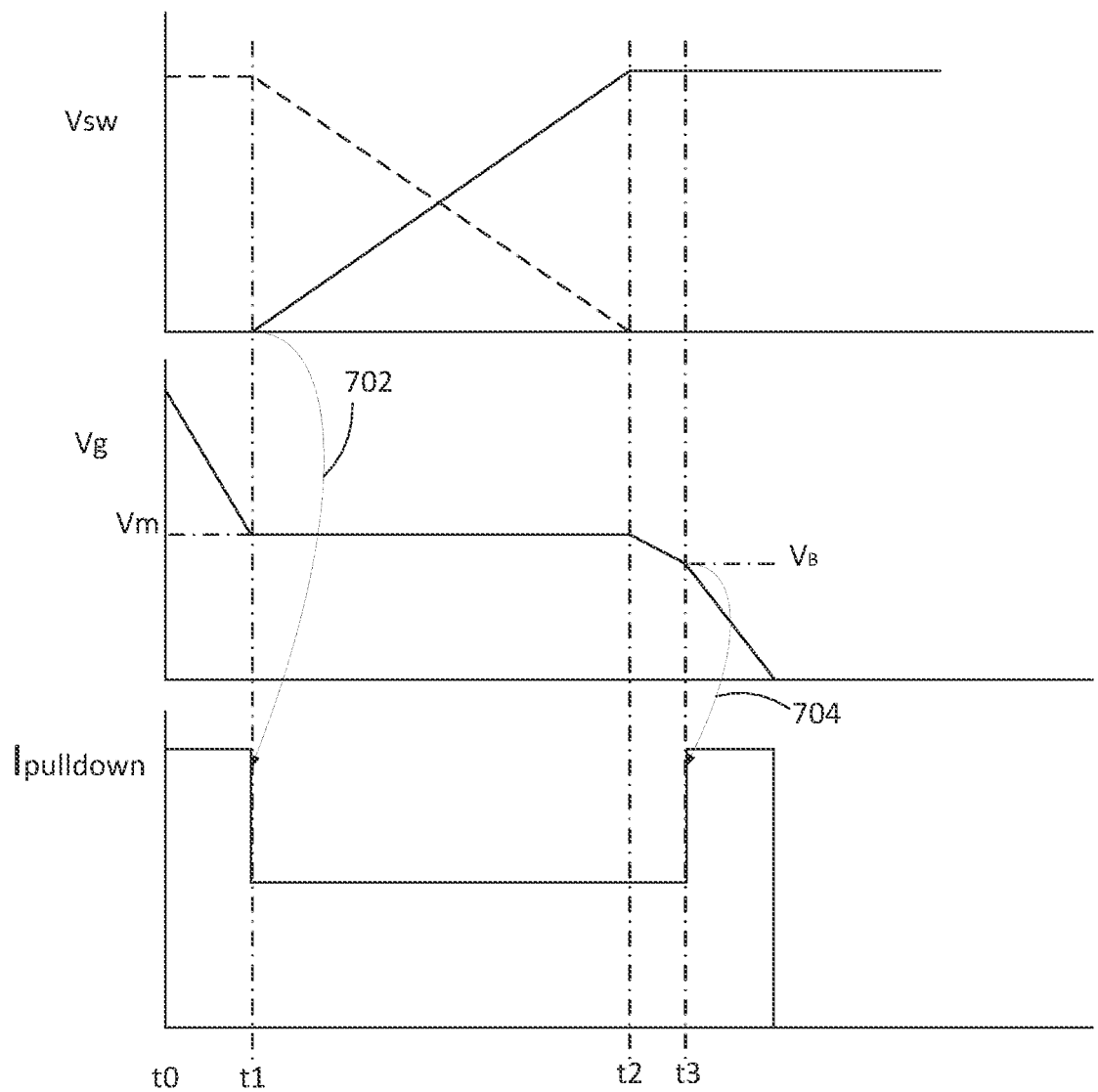
FIG. 7 illustrates a switching node voltage, a gate voltage and a pull-down drive current of the power device during a turn-off process of the power device in accordance with various embodiments of the present disclosure.

FIG. 7 illustrates a switching node voltage, a gate voltage and a pull-down drive current of the power device during a turn-off process of the power device in accordance with various embodiments of the present disclosure. When the power switch is a low side switch, the solid line of Vsw is used to determine when the power switch enters into a Miller plateau phase of the turn-off process. In particular, during the turn-off process of the power switch, from t0 to t1, the pull-down current discharges the gate-to-source capacitor of the power switch. The gate drive voltage drops from a final gate drive voltage to the Miller plateau level Vm at t1. Once the gate drive voltage reaches Vm, the switching node voltage Vsw starts to rise. The switching node voltage Vsw is compared with a first predetermined threshold. In some embodiments, the first predetermined threshold may be of a voltage level slightly higher than zero. The comparison result between the switching node voltage Vsw and the first predetermined threshold is used to determine when the power switch enters into a Miller plateau phase of the turn-off process. Once the power switch enters into a Miller plateau phase of the turn-off process, the pull-down current is reduced from a high level to a low level as indicated by the dashed line 702. When the power switch is a high side switch, the dashed line of Vsw is used to determine when the power switch enters into a Miller plateau phase of the turn-off process. In particular, during the turn-off process of the power switch, from t0 to t1, the pull-down current discharges the gate-to-source capacitor of the power switch. The gate drive voltage drops from a final gate drive voltage to the Miller plateau level Vm at t1. Once the gate drive voltage reaches Vm, the switching node voltage Vsw starts to drop. The switching node voltage Vsw is compared with a predetermined threshold. In some embodiments, the predetermined threshold may be of a voltage level slightly less than the steady state switching node voltage. The comparison result between the switching node voltage Vsw and the predetermined threshold is used to determine when the power switch enters into a Miller plateau phase of the turn-off process. Once the power switch enters into a Miller plateau phase of the turn-off process, the pull-down current is reduced from a high level to a low level.

At t2, the switching node voltage Vsw reaches a steady state level for a low side switch (the switching node voltage Vsw drops to zero for a high side switch). The gate drive voltage starts to drop. At t3, the gate drive voltage reaches $V_B$. $V_B$ is a predetermined threshold. In some embodiments, $V_B$ is less than the Miller plateau level Vm. The gate drive voltage is compared with $V_B$. The comparison result between the gate drive voltage and $V_B$ is used to determine when the power switch leaves the Miller plateau phase of the turn-off process.

It should be noted that FIG. 6 shows the switching node voltage Vsw is used to determine when the power switch enters into a Miller plateau phase of the turn-off process. This is merely an example. In alternative embodiments, the gate drive voltage may be used to determine when the power switch enters into a Miller plateau phase of the turn-off process.

It should further be noted that the comparison between the voltage on the switching node and the first predetermined threshold is used to determine when the power switch enters into a Miller plateau phase of the turn-off process. This is merely an example. In alternative embodiments, a different operating parameter can used to determine when the power switch enters into a Miller plateau phase. For example, the operating parameter may be one variable selected from the group consisting of a switching node voltage difference over time, a slew rate of the switching node voltage difference over time and a current flowing through the power switch.

Figure 8:
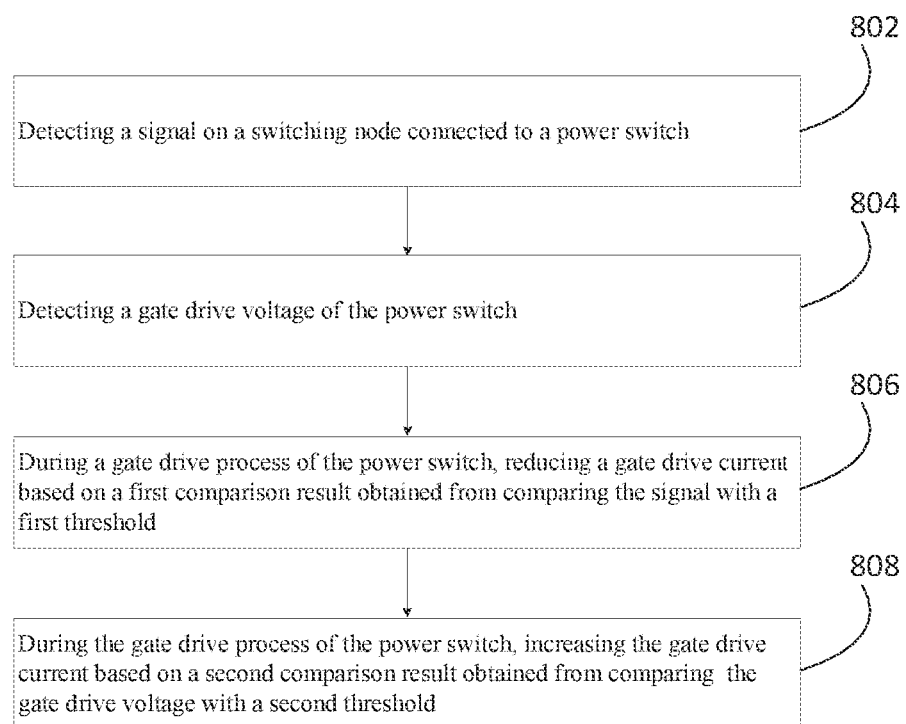
FIG. 8 illustrates a flow chart of operating the gate drive controller shown in FIG. 1 in accordance with various embodiments of the present disclosure.

FIG. 8 illustrates a flow chart of operating the gate drive controller shown in FIG. 1 in accordance with various embodiments of the present disclosure. This flowchart shown in FIG. 8 is merely an example, which should not unduly limit the scope of the claims. One of ordinary skill in the art would recognize many variations, alternatives, and modifications. For example, various steps illustrated in FIG. 8 may be added, removed, replaced, rearranged and repeated.

Referring back to FIG. 1, a gate driver controller is employed to drive a power switch (e.g., Q2). The gate drive controller comprises an adaptive slew rate control apparatus. The adaptive slew rate control apparatus comprises a pull-up gate drive circuit and a pull-down gate drive circuit.

During a turn-on process of the power switch, the pull-up gate drive circuit is able to dynamically adjust the pull-up current fed into the gate of the power switch so as to maintain the time of the Miller plateau phase the same, but significantly reduce the total turn-on gate transition time.

During a turn-off process of the power switch, the pull-down gate drive circuit is able to dynamically adjust the pull-down current fed into the gate of the power switch so as to maintain the time of the Miller plateau phase the same, but significantly reduce the total turn-off gate transition time.

At step 802, the gate drive controller is configured to detect a signal on a switching node connected to the power switch. In some embodiments, the signal is a voltage on the switching node.

At step 804, the gate drive controller is configured to detect a gate drive voltage of the power switch.

At step 806, during the gate drive process of the power switch, the gate drive controller is configured to reduce a gate drive current based on a first comparison result obtained from comparing the signal with a first threshold.

At step 808, during the gate drive process of the power switch, the gate drive controller is configured to increase the gate drive current based on a second comparison result obtained from comparing the gate drive voltage with a second threshold.

Referring back to FIG. 4, the method further comprises during a turn-on process of the power switch, reducing a pull-up current fed into a gate of the power switch from a first predetermined current level to a second predetermined current level once a voltage on the switching node changes over the first threshold, and during the turn-on process of the power switch, increasing the pull-up current fed into the gate of the power switch from the second predetermined current level to the first predetermined current level once the gate drive voltage exceeds the second threshold. The method further comprises during the turn-on process of the power switch, reducing a turn-on gate transition time through adjusting a difference between the first predetermined current level and the second predetermined current level.

During the turn-on process of the power switch, the first comparison result obtained from comparing the signal with the first threshold is used to determine when the power switch enters into a Miller plateau phase of the turn-on process.

During the turn-on process of the power switch, the second comparison result obtained from comparing the gate drive voltage with the second threshold is used to determine when the power switch leaves the Miller plateau phase of the turn-on process.

Referring back to FIG. 5, the method further comprises during a turn-off process of the power switch, reducing a pull-down current drawn from a gate of the power switch from a first predetermined current level to a second predetermined current level once a voltage on the switching node changes over the first threshold, and during the turn-off process of the power switch, increasing the pull-down current drawn from the gate of the power switch from the second predetermined current level to the first predetermined current level once the gate drive voltage drops below the second threshold. The method further comprises during the turn-off process of the power switch, reducing a turn-off gate transition time through adjusting a difference between the first predetermined current level and the second predetermined current level.

During the turn-off process of the power switch, the first comparison result obtained from comparing the signal with the first threshold is used to determine when the power switch enters into a Miller plateau phase of the turn-off process of the power switch.

During the turn-off process of the power switch, the second comparison result obtained from comparing the gate drive voltage with the second threshold is used to determine when the power switch leaves a Miller plateau phase of the turn-off process of the power switch.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising:
a pull-up gate drive circuit configured to reduce a pull-up current fed into a gate of a power switch from a first predetermined pull-up current level to a second predetermined pull-up current level once a signal on a switching node changes over a first turn-on threshold, and increase the pull-up current fed into the gate of the power switch from the second predetermined pull-up current level to the first predetermined pull-up current level once a gate drive voltage exceeds a second turn-on threshold; and
a pull-down gate drive circuit configured to reduce a pull-down current drawn from the gate of the power switch from a first predetermined pull-down current level to a second predetermined pull-down current level once the signal on the switching node changes over a first turn-off threshold, and increase the pull-down current drawn from the gate of the power switch from the second predetermined pull-down current level to the first predetermined pull-down current level once the gate drive voltage drops below a second turn-off threshold.

2. The apparatus of claim 1, wherein:
the pull-up gate drive circuit comprises a plurality of pull-up switch-resistor networks connected in parallel; and
the pull-down gate drive circuit comprises a plurality of pull-down switch-resistor networks connected in parallel.

3. The apparatus of claim 1, wherein:
the pull-up gate drive circuit and the pull-down gate drive circuit are connected in series between a bias voltage bus and ground, and wherein a common node of the pull-up gate drive circuit and the pull-down gate drive circuit is connected to the gate of the power switch.

4. The apparatus of claim 1, wherein:
the pull-up gate drive circuit comprises a plurality of pull-up switches connected in parallel; and
the pull-down gate drive circuit comprises a plurality of pull-down switches connected in parallel.

5. The apparatus of claim 4, wherein:
at least one gate drive voltage applied to one of the plurality of pull-up switches is modulated so as to adjust the pull-up current flowing through the pull-up gate drive circuit.

6. The apparatus of claim 4, wherein:
at least one gate drive voltage applied to one of the plurality of pull-down switches is modulated so as to adjust the pull-down current flowing through the pull-down gate drive circuit.

7. The apparatus of claim 1, wherein:
the signal on the switching node is a voltage on the switching node.

8. The apparatus of claim 1, wherein:
the signal on the switching node is a variable selected from the group consisting of a switching node voltage difference over time, a slew rate of the switching node voltage difference over time and a current flowing through the power switch.

9. A method comprising:
directly detecting, by a sensing circuit, a voltage on a common node of a power switch and an adjacent power switch connected to the power switch;
detecting a gate drive voltage of the power switch;
during a gate drive process of the power switch, reducing a gate drive current based on a first comparison result obtained from comparing the voltage with a first threshold; and
during the gate drive process of the power switch, increasing the gate drive current based on a second comparison result obtained from comparing the gate drive voltage with a second threshold.

10. The method of claim 9, further comprising:
during a turn-on process of the power switch, reducing a pull-up current fed into a gate of the power switch from a first predetermined current level to a second predetermined current level once the voltage on the switching node changes over the first threshold; and
during the turn-on process of the power switch, increasing the pull-up current fed into the gate of the power switch from the second predetermined current level to the first predetermined current level once the gate drive voltage exceeds the second threshold.

11. The method of claim 10, further comprising:
during the turn-on process of the power switch, reducing a turn-on gate transition time through adjusting a difference between the first predetermined current level and the second predetermined current level.

12. The method of claim 10, wherein:
during the turn-on process of the power switch, the first comparison result obtained from comparing the signal with the first threshold is used to determine when the power switch enters into a Miller plateau phase of the turn-on process.

13. The method of claim 12, wherein:
during the turn-on process of the power switch, the second comparison result obtained from comparing the gate drive voltage with the second threshold is used to determine when the power switch leaves the Miller plateau phase of the turn-on process.

14. The method of claim 9, further comprising:

during a turn-off process of the power switch, reducing a pull-down current drawn from a gate of the power switch from a first predetermined current level to a second predetermined current level once the voltage on the switching node changes over the first threshold; and during the turn-off process of the power switch, increasing the pull-down current drawn from the gate of the power switch from the second predetermined current level to the first predetermined current level once the gate drive voltage drops below the second threshold.

15. The method of claim 14, further comprising:

during the turn-off process of the power switch, reducing a turn-off gate transition time through adjusting a difference between the first predetermined current level and the second predetermined current level.

16. The method of claim 14, wherein:

during the turn-off process of the power switch, the first comparison result obtained from comparing the signal with the first threshold is used to determine when the power switch enters into a Miller plateau phase of the turn-off process of the power switch.

17. The method of claim 14, wherein:

during the turn-off process of the power switch, the second comparison result obtained from comparing the gate drive voltage with the second threshold is used to determine when the power switch leaves a Miller plateau phase of the turn-off process of the power switch.

18. A controller comprising:

a first sensing circuit configured to receive a gate drive voltage of a power switch;

a second sensing circuit configured to receive a voltage on a switching node connected to the power switch; and an adaptive slew rate control apparatus comprising a pull-up gate drive circuit and a pull-down gate drive circuit, wherein:

the pull-up gate drive circuit is configured to reduce a pull-up current fed into a gate of the power switch from a first predetermined pull-up current level to a second predetermined pull-up current level once the voltage on the switching node changes over a first turn-on threshold, and increase the pull-up current fed into the gate of the power switch from the second predetermined pull-up current level to the first predetermined pull-up current level once the gate drive voltage exceeds a second turn-on threshold; and the pull-down gate drive circuit is configured to reduce a pull-down current drawn from the gate of the power switch from a first predetermined pull-down current level to a second predetermined pull-down current level once the voltage on the switching node changes over a first turn-off threshold, and increase the pull-down current drawn from the gate of the power switch from the second predetermined pull-down current level to the first predetermined pull-down current level once the gate drive voltage drops below a second turn-off threshold.

19. The controller of claim 18, wherein:

the pull-up gate drive circuit comprises a plurality of pull-up switch-resistor networks connected in parallel, and wherein each pull-up switch-resistor network comprises a first switch and a first resistor connected in series between a first voltage bus and the gate of the power switch; and the pull-down gate drive circuit comprises a plurality of pull-down switch-resistor networks connected in parallel, and wherein each pull-down switch-resistor network comprises a second resistor and a second switch connected in series between the gate of the power switch and a second voltage bus lower than the first voltage bus.

20. The controller of claim 18, wherein:

the first predetermined pull-up current level is at least twice the second predetermined pull-up current level; and the first predetermined pull-down current level is at least twice the second predetermined pull-down current level.

\* \* \* \* \*